United States Patent
Kato et al.

(10) Patent No.: US 7,193,362 B2
(45) Date of Patent: Mar. 20, 2007

(54) PLANAR LUMINESCENT DEVICE HAVING AUXILIARY ELECTRODE AND DIFFUSION MECHANISM

(75) Inventors: Yoshifumi Kato, Kariya (JP); Masato Hieda, Kariya (JP); Mitsuhara Muta, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 260 days.

(21) Appl. No.: 10/859,753

(22) Filed: Jun. 3, 2004

(65) Prior Publication Data

US 2004/0251825 A1    Dec. 16, 2004

(30) Foreign Application Priority Data

Jun. 6, 2003  (JP) .............................. 2003-162447

(51) Int. Cl.
*H01J 1/62* (2006.01)
(52) U.S. Cl. ...................... 313/506; 313/501
(58) Field of Classification Search .............. 313/110, 313/116, 501, 506
See application file for complete search history.

(56) References Cited

U.S. PATENT DOCUMENTS 6,626,550 B2    9/2003    Choi ............................ 362/31

FOREIGN PATENT DOCUMENTS

| CN | 1349126 A | 5/2002 |
| EP | 0 969 699 A1 | 1/2000 |
| JP | 09-178914 | 7/1997 |
| JP | 2000-231985 | 8/2000 |
| JP | 2002-156633 | 5/2002 |
| JP | 2004-14128 | 1/2004 |

*Primary Examiner*—Joseph Williams
*Assistant Examiner*—Bumsuk Won
(74) *Attorney, Agent, or Firm*—Morgan & Finnegan, L.L.P.

(57) ABSTRACT

A luminescent device for reducing unevenness of brightness. The luminescent device includes a transparent substrate, which has a light exit surface and an incident surface, and a luminescent element, which is formed on the incident surface of the transparent substrate. The luminescent element includes a transparent electrode formed on the incident surface of the transparent substrate, an auxiliary electrode formed on a part of the transparent electrode, and a thin-film layer, which is formed on the transparent electrode, for emitting light. The transparent substrate includes a projection formed on the light exit surface.

24 Claims, 5 Drawing Sheets

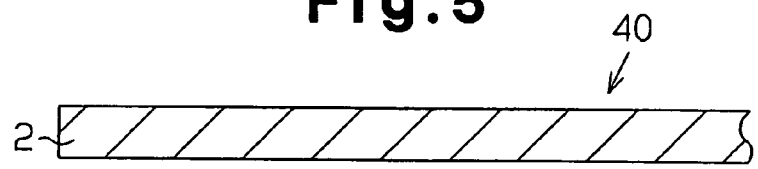
Fig.5
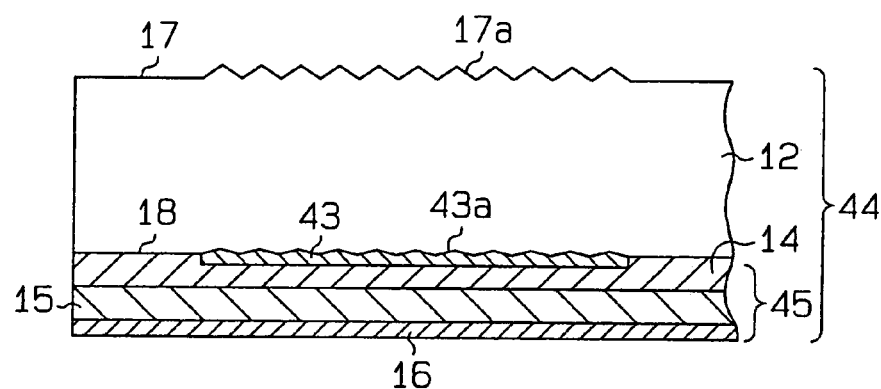
Fig.6
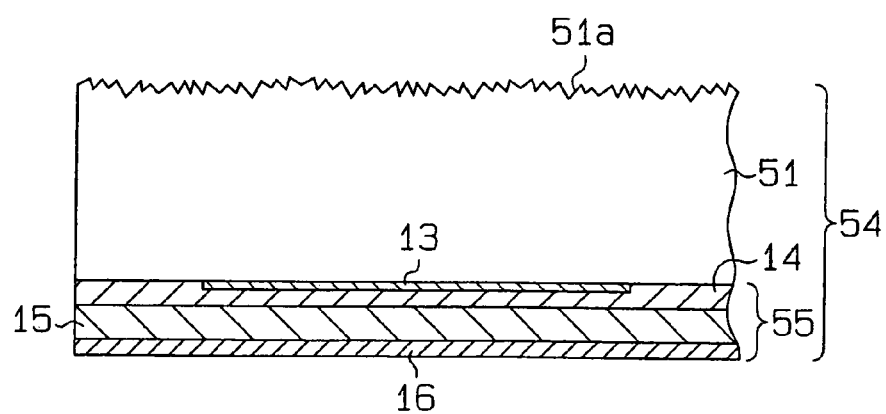

PLANAR LUMINESCENT DEVICE HAVING AUXILIARY ELECTRODE AND DIFFUSION MECHANISM

BACKGROUND OF THE INVENTION

The present invention relates to a luminescent device, and more specifically, to a luminescent device including an auxiliary electrode.

In a display including a luminescent element like an organic electroluminescence element, and a transparent electrode, the transparent electrode is mainly made of, for example, indium tin oxide (ITO) or zinc oxide (ZnO).

The conductivity of a transparent electrode is low. Thus, when using a transparent electrode, there is a large difference between the electrical resistance at a region close to a connecting terminal and the electrical resistance at a region distant from the connecting terminal. This results in a large difference between the value of the current flowing through the region close to the connecting terminal and the value of the current flowing the region distant from the connecting terminal. The current value affects the luminous brightness of the organic electroluminescence element. Consequently, this causes uneven luminous brightness.

Japanese Laid-Open Patent Publication No. 2002-156633 discloses a liquid crystal display that includes an auxiliary electrode formed on the transparent electrode to control uneven brightness.

However, in such a liquid crystal display, the auxiliary electrode is made of a non-transmissive material. Thus, the auxiliary electrode must be formed in accordance with the pixels of the liquid crystal, and uneven brightness cannot be sufficiently suppressed.

SUMMARY OF THE INVENTION

It is an object of the present invention to provide a luminescent device that reduces uneven brightness even when using an auxiliary electrode.

To achieve the above object, the present invention provides a luminescent device provided with a transparent substrate including a light exit surface, an incident surface, and a projection formed on the light exit surface. A luminescent element is formed on the incident surface of the transparent substrate. The luminescent element includes a transparent electrode formed on the incident surface of the transparent substrate. An auxiliary electrode is formed on part of the transparent electrode. A thin-film layer, formed on the transparent electrode, emits light.

A further aspect of the present invention provides a luminescent device provided with a transparent substrate including a light exit surface and an incident surface. An optical sheet has a projection and is formed on the light exit surface of the transparent substrate. A luminescent element is formed on the incident surface of the transparent substrate. The luminescent element includes a transparent electrode formed on the incident surface of the transparent substrate, an auxiliary electrode formed on part of the transparent electrode, and a thin-film layer, formed on the transparent electrode, for emitting light.

A further aspect of the present invention is a luminescent device provided with a transparent substrate including a light exit surface and an incident surface. The light exit surface includes a diffusion mechanism for diffusing light. A luminescent element is formed on the incident surface of the transparent substrate. The luminescent element includes a transparent electrode formed on the incident surface of the transparent substrate, an auxiliary electrode formed on part of the transparent electrode, and a thin-film layer, formed on the transparent electrode, for emitting light.

A further aspect of the present invention is a luminescent device provided with a transparent substrate including a light exit surface and an incident surface. An optical sheet is formed on the light exit surface of the transparent substrate and includes a diffusion mechanism for diffusing light. A luminescent element is formed on the incident surface of the transparent substrate. The luminescent element includes a transparent electrode formed on the incident surface of the transparent substrate, an auxiliary electrode formed on part of the transparent electrode, and a thin-film layer, formed on the transparent electrode, for emitting light Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a schematic cross sectional view of a transmissive liquid crystal display according to a third embodiment of the present invention;

FIG. 6 is a schematic cross sectional view of a transmissive liquid crystal display according to a fourth embodiment of the present invention;

DETAILED DESCRIPTION OF THE PREFERRED EMBODIMENTS

Figure 1:
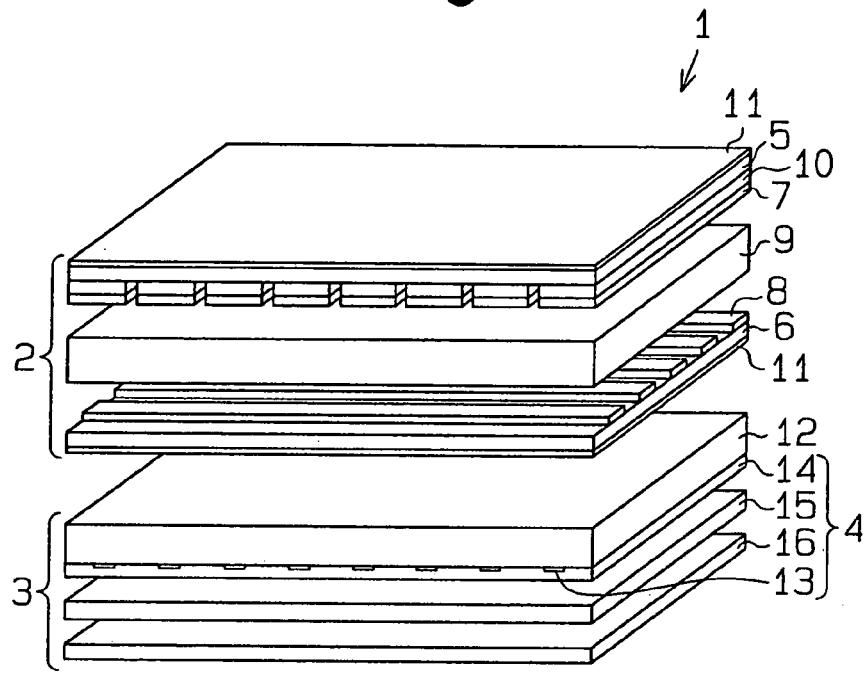
FIG. 1 is a schematic perspective view of a transmissive liquid crystal display according to a first embodiment of the present invention.

In the drawings, same numerals are used for same or similar elements throughout.

First Embodiment

An organic electroluminescence device 3 according to a first embodiment of the present invention will now be described with reference to FIGS. 1 to 3. The organic electroluminescence device 3 is used as a backlight for a passive matrix transmissive liquid crystal display 1.

As shown in FIG. 1, the transmissive liquid crystal display 1 includes a passive matrix liquid crystal panel 2 and an organic electroluminescence device 3, which serves as an area light-emitting device.

The liquid crystal panel 2, which is a known panel, includes a first transparent substrate 5, a second transparent substrate 6, and a liquid crystal layer 9, which is arranged between the first transparent substrate 5 and the second transparent substrate 6.

Two polarizing plates 11 are each arranged on an outer surface of the first transparent substrate 5 and an outer surface of the second transparent substrate 6.

Parallel strips of plural parallel color filters 10 are formed on the surface of the first transparent substrate 5 facing towards the liquid crystal layer 9. An electrode 7 is formed on each of the color filters 10.

Parallel strips of plural opposing electrodes 8 are formed on the surface of the second transparent substrate 6 facing towards the liquid crystal layer 9. The opposing electrodes 8 extend in a direction orthogonal to the color filters 10 and the electrodes 7.

The liquid crystal layer 9 is arranged between the electrodes 7 and the opposing electrodes 8. The first transparent substrate 5 and the second transparent substrate 6 are separated from each other with a uniform distance. In this state, a sealing member (not shown) bonds the transparent substrates 5 and 6 to each other. The electrodes 7 and the opposing electrodes 8 sandwich the liquid crystal layer 9. Pixels are formed at intersections of the electrodes 7 and the opposing electrodes 8. The pixels are arranged in a matrix-like manner.

Figure 2:
FIG. 2 is a schematic cross sectional view showing an optical path in the transmissive liquid crystal display of FIG. 1.
Figure 2:
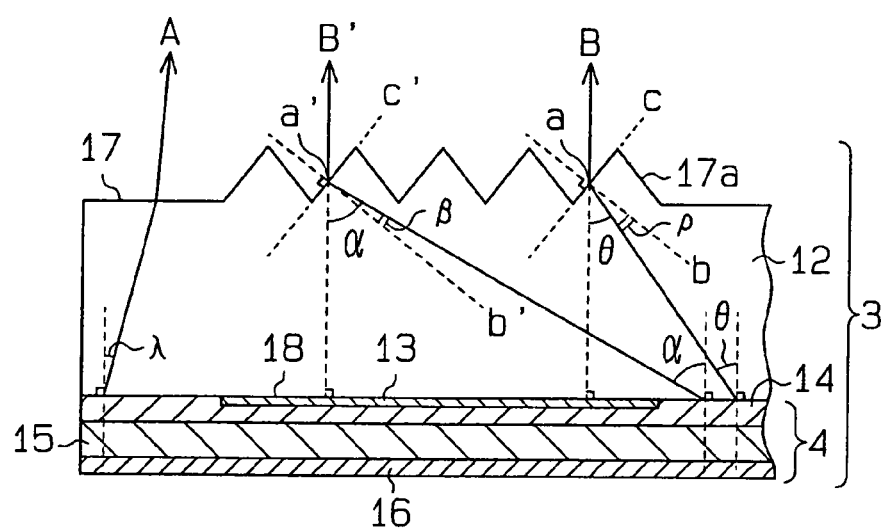
Figure 3:
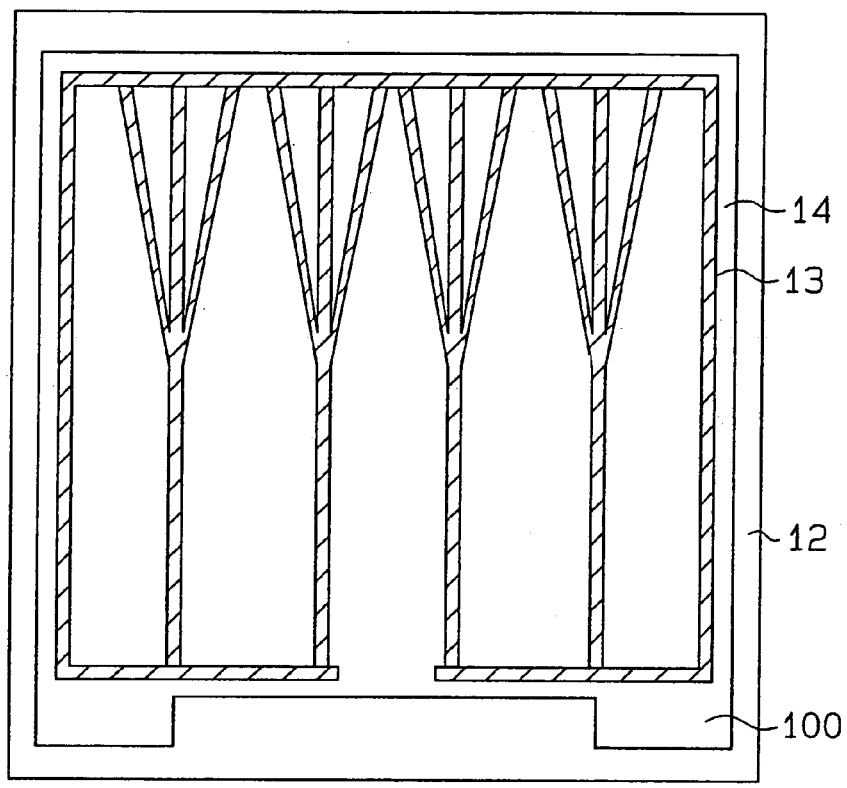
FIG. 3 is a schematic diagram showing an auxiliary electrode for an organic electroluminescence element of the transmissive liquid crystal display of FIG. 1.

As shown in FIGS. 1 and 2, the organic electroluminescence device 3 includes a transparent substrate 12 and an organic electroluminescence element (area light-emitting element) 4. The transparent substrate 12 has an incident surface 18 and a light exit surface 17. The organic electroluminescence element 4 is formed on the incident surface 18 of the transparent substrate 12.

The organic electroluminescence element 4 is covered with a protective film (not shown) such as a passivation film.

The organic electroluminescence element 4 includes a transparent electrode 14 formed on the incident surface 18 of the transparent substrate 12, an auxiliary electrode 13 formed on the surface of the transparent electrode 14 facing towards the transparent substrate 12, an organic thin-film layer 15 formed on the surface of the transparent electrode 14 facing away from the auxiliary electrodes 13, and a metal electrode 16 formed on the organic thin-film layer 15.

A material having a relatively large work function (4eV or greater), such as a metal, an alloy, an electrically conductive compound, and a mixture of these substances is preferably used for the transparent electrode 14. Metals, such as Au, and conductive transparent or translucent materials, such as CuI, ITO, $SnO_2$, and ZnO, may be used as examples of materials suitable for the transparent electrode 14. The transparent electrode 14 is a thin film formed by performing deposition or sputtering with such a substance.

The auxiliary electrode 13 is made of a non-transmissive metal material, such as aluminum. The auxiliary electrode 13 is electrically connected in parallel to the transparent electrode 14 and function to lower the resistance between a connecting terminal 100 (see FIG. 3) and the organic thin-film layer 15. The auxiliary electrode 13 is formed in a striped manner. Further, the auxiliary electrode 13 is branched. The branches of the auxiliary electrode 13 are roughly arranged at a region close to the connecting terminal 100, and are thickly arranged at a region distant from the connecting terminal 100. The region close to the connecting terminal 100 is the region where the distance between the transparent electrode 14 and the connecting terminal 100 via the auxiliary electrode 13 is short. The region distant from the connecting terminal 100 is the region where the distance between the transparent electrode 14 and the connecting terminal 100 via the auxiliary electrode 13 is long. The electrical resistance between distant region and the connecting terminal 100 is decreased by the arrangement of the auxiliary electrode 13. This reduces the voltage drop rate and suppresses the occurrence of uneven brightness.

The auxiliary electrode 13 lowers the aperture efficiency since they are made of a non-transmissive material. Further, if the auxiliary electrode 13 were to be made of a material having high thermal conductivity, such as aluminum, the auxiliary electrode 13 would lower the ambient temperature. Since the auxiliary electrode 13 lowers the aperture efficiency as well as temperature, the auxiliary electrode 13 reduces the brightness nearby. Thus, the designer must arrange the auxiliary electrode 13 in accordance with the properties of the auxiliary electrode 13.

In the first embodiment, the distance between the auxiliary electrodes 13 is large in the region close to the connecting terminal 100. Thus, the aperture efficiency at this region is high. In the region distant from the connecting terminal 100, the distance between the auxiliary electrodes 13 is small. Thus, the aperture efficiency at this region is low.

A material having a small work function (4 eV or less), such as a metal, an alloy, an electrically conductive compound and a mixture of these substances is used for the metal electrode 16. Sodium, sodium potassium alloys, magnesium, lithium, magnesium-copper mixture, $Al/(Al_2O_3)$, indium, rare earth metal may be used for forming the metal electrode 16. The metal electrode 16 is a thin film formed by performing deposition or sputtering with such a substance.

The organic thin-film layer 15 may be a single-layer structure including only a luminescent layer. Alternatively, the organic thin-film layer 15 may have a multi-layer structure in which a luminescent layer is formed with at least one of a hole injection layer, a hole transport layer, a hole injection transport layer, a hole blocking layer, an electron injection layer, an electron transport layer, and an electron blocking layer.

The organic thin-film layer 15 of the first embodiment has a multi-layer structure including a hole injection layer, a hole transport layer, a luminescent layer, an electron transport layer, and an electron injection layer that are laminated with one another. A red luminescent layer, a green luminescent layer, and a blue luminescent layer are laminated with one another so that a white light is emitted from the organic thin-film layer 15.

The transparent substrate 12 is a substrate that transmits, at least partially or entirely, visible light and is made of, for example, glass or resin. In the first embodiment, a glass transparent substrate 12 is used. As shown in FIG. 2, parallel microscopic prisms, or projections 17a having triangular cross sections are formed on the light exit surface 17 of the transparent substrate 12 in correspondence with the auxiliary electrodes 13.

The operation of the liquid crystal display 1 will now be described with reference to FIGS. 1 and 2.

When voltage is applied between the transparent electrode 14 and the auxiliary electrodes 13 and the metal electrode 16 in the organic electroluminescence element 4, the luminescent layer of the organic thin-film layer 15 emits a white light. Most of the light is emitted towards the transparent substrate 12.

In the first embodiment, the luminescent layer of the organic electroluminescence element 4 is planar. In other words, it may be viewed that luminescent points are continuously arranged on a plane. The light is evenly emitted in all directions from each luminescent point. Since the luminescent points are continuously arranged on a plane, light enters the incident surface 18 of the transparent substrate 12 from all directions. Therefore, the organic electroluminescence element 4 of the first embodiment is an area light-emitting element.

With regard to the organic electroluminescence device 3 including the organic electroluminescence element 4, the optical path of the transparent substrate 12 that has the projections 17a will now be discussed. As shown in FIG. 2, the light emitted from the luminescent layer enters the transparent substrate 12.

In the first embodiment, the critical angle of the light exiting from the transparent substrate 12 is determined by the refractive index of glass and the refractive index of air. Light that enters the transparent substrate 12 at angle $\lambda$, which is smaller than the critical angle, and reaches the flat portion (portions excluding the projections 17a) of the light exit surface 17 (light denoted by A in FIG. 2) is refracted at the interface between the transparent substrate 12 and air (light exit surface 17). The light then exits from the transparent substrate 12.

As shown in FIG. 2, light also enters the transparent substrate 12 at angle $\alpha$ or $\theta$, which is greater than the critical angle, and reaches the projections 17a on the light exit surface 17 (light denoted by B or B' in FIG. 2). The critical angle of such light at the projections 17a is determined using a tangent line c or c' drawn at an incident point a or a'. The angle of incidence of such light at the surface of the projection 17a is $\beta$ or $\rho$. Such an angle of incidence $\beta$ or $\rho$ relative to the plane of each projection 17a is less than or equal to the critical angle at the projection 17a.

Therefore, among light rays entering the transparent substrate 12 at an angle ($\alpha$, $\theta$) that is greater than the critical angle, the light rays reaching the projection 17a are not completely reflected into the transparent substrate 12 and are emitted out of the transparent substrate 12 through the projections 17a. In other words, light that otherwise would not exit the transparent substrate 12 if the entire light exit surface 17 was flat, exits due to the projections 17a. Thus, light emitted from the organic electroluminescence element 4 also exits the light exit surface 17 of the transparent substrate 12 from portions corresponding to the auxiliary electrodes 13. That is, light exits from the entire light exit surface 17 of the transparent substrate 12. The designer does not have to take into consideration the light blocked by the auxiliary electrodes 13 and may freely arrange the auxiliary electrodes 13.

The light that exits the light exit surface 17 of the transparent substrate 12 enters the liquid crystal panel 2 from the rear surface of the liquid crystal panel 2 (i.e., the surface facing away from an observer viewing the panel 2) and is transmitted or blocked by each of the pixels of the liquid crystal panel 2. The observer visually recognizes light exiting the liquid crystal panel 2, as a whole, that is, as forming a symbol and/or an image.

The organic electroluminescence device 3 of the first embodiment has the following advantages.

(1) In the first embodiment, the projections 17a are formed on the light exit surface 17 from which the light of the transparent substrate 12 exits. Accordingly, even if light enters the transparent substrate 12 at an angle (e.g., angle $\alpha$ or $\theta$) that is greater than the critical angle, the angle of the light relative to the plane of each projection 17a is smaller than or equal to the critical angle. Therefore, light also exits from portions of the light exit surface 17 of the transparent substrate 12 that correspond to the auxiliary electrode 13. That is, light exits from the entire light exit surface 17 of the transparent substrate 12. This reduces unevenness of brightness and allows the designer to freely arrange the auxiliary electrode 13.

(2) The projections 17a are formed on the light exit surface 17 of the transparent substrate 12 only at portions corresponding to the auxiliary electrodes 13. Therefore, the amount of light reflected by the flat portion of the light exit surface 17 and reaching an auxiliary electrode 13 (amount of wave guide within the transparent substrate) is subtly reduced. In other words, the amount of light reflected by the auxiliary electrodes 13 is subtly reduced. This suppresses the occurrence of uneven brightness.

Second Embodiment

Figure 4:
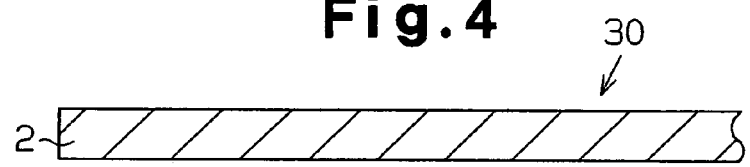
FIG. 4 is a schematic cross sectional view of a transmissive liquid crystal display according to a second embodiment of the present invention.
Figure 4:
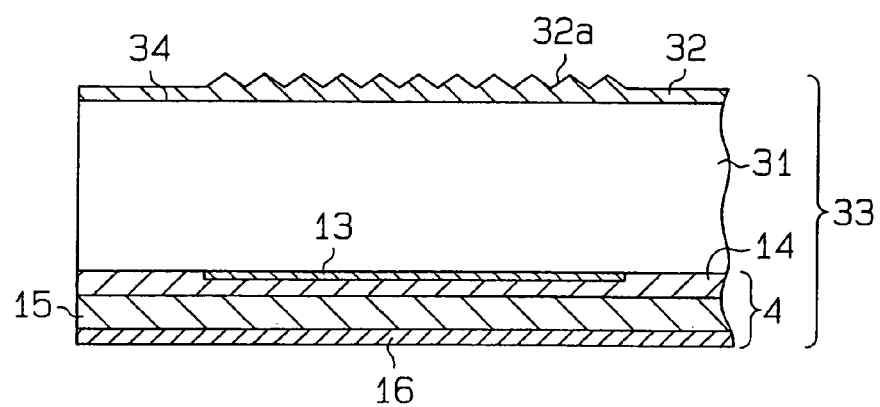

In a second embodiment of the present invention, an organic electroluminescence device 33 of a passive matrix transmissive liquid crystal display 30 includes a transparent substrate 31 including a planar light exit surface 34, as shown in FIG. 4. A prism sheet, which is an optical sheet, is arranged on the light exit surface 34 of the transparent substrate 31. With regard to other parts, the configuration of the liquid crystal display 30 is the same as that of the liquid crystal display 1 in the first embodiment.

Parallel microscopic prisms, or projections 32a, having triangular cross section are formed at portions of the prism sheet 32 corresponding to the auxiliary electrode 13.

The organic electroluminescence device 33 of the second embodiment has the same advantages as the organic electroluminescence device 3 of the first embodiment.

Third Embodiment

In a third embodiment of the present invention, an organic electroluminescence element 45 of an organic electroluminescence device 44 for a passive matrix transmissive liquid crystal display 40 includes an auxiliary electrode 43. As shown in FIG. 5, parallel microscopic prisms, or projections 43a, having triangular cross sections are formed on the surface of the auxiliary electrode 43 facing towards the transparent substrate 12. In other words, the auxiliary electrode 43 has an uneven surface. With regard to other parts, the configuration of the liquid crystal display 40 is the same as that of the liquid crystal display 1 in the first embodiment.

The organic electroluminescence device 44 of the third embodiment has the following advantages in addition to the above advantages (1) and (2).

The projections 43a are formed on the surface of the auxiliary electrode 43 facing towards the transparent substrate 12. Thus, the angle of the light traveling in the transparent substrate 12 and reaching the auxiliary electrodes 43 is changed when reflected on the projections 43a. Such change in the angle of light causes light to exit the light exit surface 17 of the transparent substrate 12 from portions corresponding to the auxiliary electrode 43. In other words, the projections 43a of the auxiliary electrode 43 increases the amount of light exiting from the portion of the light exit surface 17 corresponding to the auxiliary electrode 43. This suppresses unevenness of brightness.

Fourth Embodiment

In a fourth embodiment of the present invention, a transparent substrate 51 of an organic electroluminescence device 54 for a passive matrix transmissive liquid crystal display 50 includes, as shown in FIG. 6, a light exit surface 51a (diffusion mechanism) having an uneven portion. The light exit surface 51a is formed by performing, for example, sand blasting. With regard to other parts, the configuration of the liquid crystal display 50 is the same as that of the liquid crystal display 1 in the first embodiment.

In the fourth embodiment, the light exit surface 51a diffuses light so that the light uniformly exits the light exit surface 51a of the transparent substrate 51 in all directions. This enables the designer to freely arrange an auxiliary electrode.

It should be apparent to those skilled in the art that the present invention may be embodied in many other specific forms without departing from the spirit or scope of the invention. Particularly, it should be understood that the present invention may be embodied in the following forms.

In the above embodiments, an organic electroluminescence element is used as the area light-emitting element. However, an inorganic electroluminescence element may also be used as the area light-emitting element. Even if an inorganic electroluminescence element is used, the same advantages as when using an organic electroluminescence element are obtained.

Figure 7:
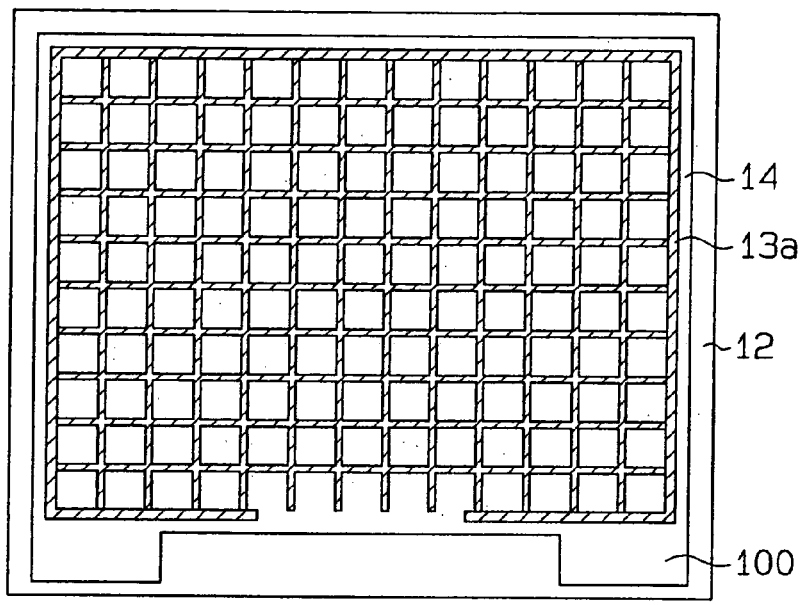
FIG. 7 is a schematic diagram showing an auxiliary electrode for an organic electroluminescence element according to another embodiment of the present invention.
Figure 8:
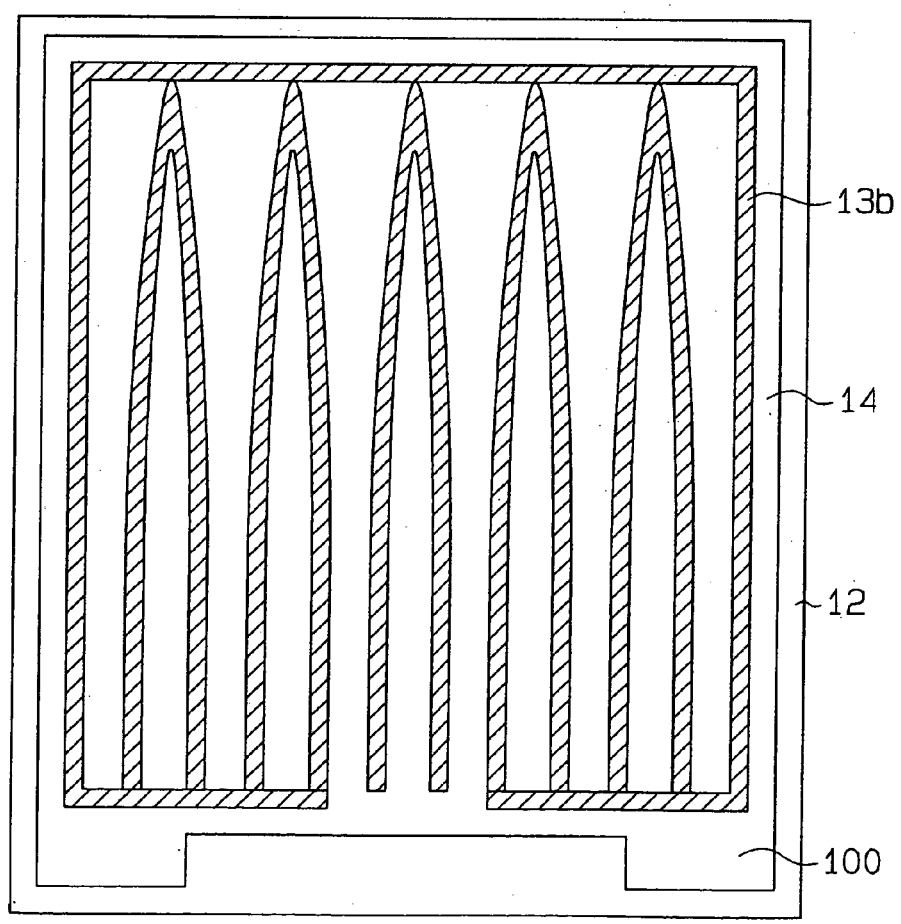
FIG. 8 is a schematic diagram showing an auxiliary electrode of an organic electroluminescence element according to a further embodiment of the present invention.

In the first to the third embodiments, the auxiliary electrode is formed in a striped manner. However, the auxiliary electrode may be formed in any shape in accordance with the application. As shown in FIG. 7, for example, an auxiliary electrode 13 may have a mesh-shaped form. Further, as shown in FIG. 8, the distance between the elements of an auxiliary electrode 13b may be narrowed as the distance from the connecting terminal 100 becomes greater.

In the above embodiments, the auxiliary electrode is configured in consideration of the fact that the amount of voltage drop increases as the distance from the connecting terminal becomes greater. However, other facts may also be taken into consideration when designing the auxiliary electrode. For example, when light is being emitted, heat is collected at the central portion of an organic electroluminescence device. This increases brightness at the central portion in comparison to peripheral portions of the organic electroluminescence device. Taking this fact into consideration, the auxiliary electrode may be formed in a concentrated manner at the central portion. In this configuration, the auxiliary electrode releases the heat at the central portion and lowers the aperture efficiency. This suppresses unevenness of brightness.

Figure 9:
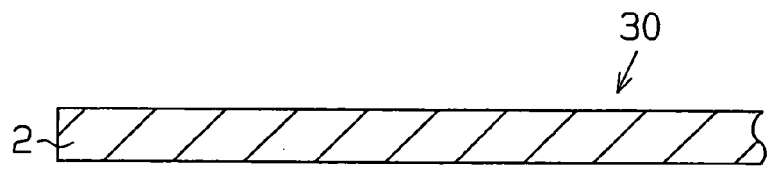
FIG. 9 is a schematic cross sectional view of a transmissive liquid crystal display according to yet another embodiment of the present invention.
Figure 9:
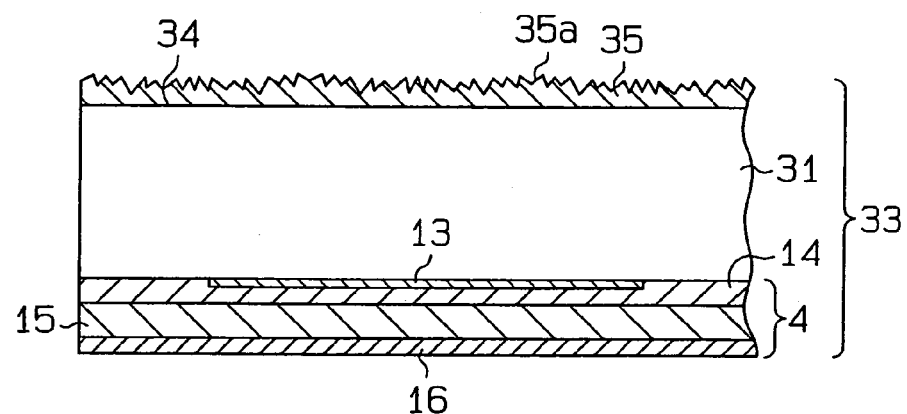

In the second embodiment, the prism sheet 32 including the projections 32a is arranged on the light exit surface 34 of the transparent substrate 31. In the fourth embodiment, the transparent substrate 51 includes the light exit surface 51a having projections formed randomly by performing, for example, sand blasting. Instead of such configurations, an optical sheet 35 including a light exit surface 35a provided with a diffusion mechanism may be arranged on the light exit surface 34 of the transparent substrate 31, as shown in FIG. 9. The diffusion mechanism is not limited to the configuration described above, and may be configured by, for example, including beads in the transparent substrate or the optical sheet.

In the above embodiments, the branches of the auxiliary electrode are roughly arranged at a region close to the connecting terminal, and are thickly arranged at a region distant from the connecting terminal. Conversely, the branches of the auxiliary electrode may be thickly arranged at a region close to the connecting terminal, and are roughly arranged at a region distant from the connecting terminal. The auxiliary electrodes may be arranged taking into consideration the balance between the current value, the aperture efficiency, and the luminescence heat.

In the above embodiments, unevenness of brightness is suppressed by arranging the branches of the auxiliary electrode thickly of roughly. However, unevenness of brightness may also be suppressed by, for example, changing the width of the auxiliary electrode.

In the above embodiments, projections are formed at a portion corresponding to the auxiliary electrodes in the light exit surface of the transparent substrate or at a portion corresponding to the auxiliary electrode in the light exit surface of the prism sheet. However, the projections may be formed on the entire light exit surface of the transparent substrate or the entire light exit surface of the prism sheet.

In the above embodiments, an organic electroluminescence device (area light-emitting device) is used in the passive matrix transmissive liquid crystal display. However, since it is only required that the liquid crystal display be transmissive, the organic electroluminescence device may also be used in an active matrix transmissive liquid crystal display.

Figure 10:
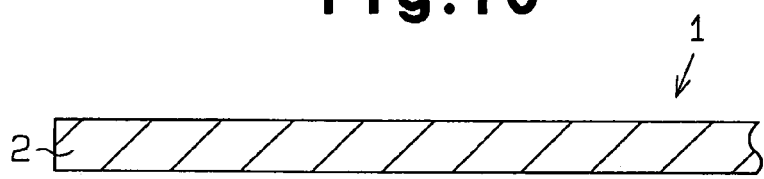
FIG. 10 is a schematic cross sectional view of a transmissive liquid crystal display according to still another embodiment of the present invention.
Figure 10:
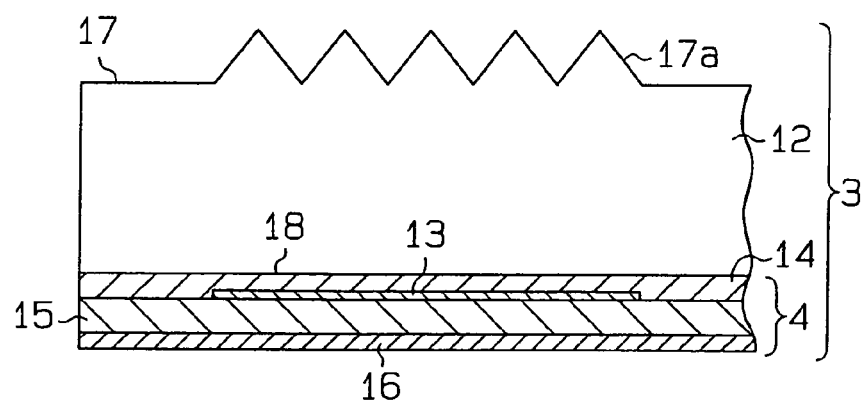

In the above embodiments, the auxiliary electrode is arranged between the transparent substrate and the transparent electrode. However, in first embodiment, the auxiliary electrode 13 may be formed between the transparent electrode 14 and the organic thin-film layer 15 as shown in FIG. 10. Similarly, in the embodiments shown in FIG. 4 to 6 and FIG. 9, the auxiliary electrode may be arranged between the transparent electrode and the organic thin-film layer. Further, the organic electroluminescence device may include two layers of a transparent electrode, and the auxiliary electrode may be formed between the two layers of the transparent electrode.

In the above embodiments, the organic electroluminescence device is used as a backlight for the liquid crystal display. However, the organic electroluminescence device of the present invention may also be applied to, for example, a normal lighting device such as an interior light for a vehicle.

In the third embodiment, the transmissive liquid crystal display 40, which is similar to the transmissive liquid crystal display 1 shown in FIG. 2, includes an auxiliary electrode 43 having an uneven surface. In the same manner, the transmissive liquid crystal display shown in FIGS. 4, 6, and 9 may also include an auxiliary electrode having an uneven surface.

The present examples and embodiments are to be considered as illustrative and not restrictive, and the invention is not to be limited to the details given herein, but may be modified within the scope and equivalence of the appended claims.

What is claimed is:

1. A luminescent device comprising:
    a transparent substrate including a light exit surface, an incident surface, and a projection formed on the light exit surface; and
    a luminescent element formed on the incident surface of the transparent substrate, the luminescent element including:
        a transparent electrode formed on the incident surface of the transparent substrate;
        an auxiliary electrode formed on part of the transparent electrode; and
        a thin-film layer, formed on the transparent electrode, for emitting light,
    wherein the projection is formed on the light exit surface at only a portion corresponding to the auxiliary electrode.

2. The device as claimed in claim 1, wherein the projection is a prism having a triangular cross section.

3. The device as claimed in claim 1, wherein the auxiliary electrode includes an uneven surface facing towards the transparent substrate.

4. The device as claimed in claim 1, wherein the luminescent element is an organic electroluminescence element.

5. The device as claimed claim 1, wherein the auxiliary electrode is formed between the transparent substrate and the transparent electrode.

6. The device as claimed in claim 1, wherein the auxiliary electrode is formed between the transparent electrode and the thin-film layer.

7. A luminescent device comprising:
- a transparent substrate including a light exit surface and an incident surface;
- an optical sheet having a projection and arranged on the light exit surface of the transparent substrate; and
- a luminescent element formed on the incident surface of the transparent substrate, the luminescent element including:
  - a transparent electrode formed on the incident surface of the transparent substrate;
  - an auxiliary electrode formed on part of the transparent electrode; and
  - a thin-film layer, formed on the transparent electrode, for emitting lights,
- wherein the projection is formed on the optical sheet at only a portion corresponding to the auxiliary electrode.

8. The device as claimed in claim 7, wherein the projection is a prism having a triangular cross section.

9. The device as claimed in claim 7, wherein the auxiliary electrode includes an uneven surface facing towards the transparent substrate.

10. The device as claimed in claim 7, wherein the luminescent element is an organic electroluminescence element.

11. The device as claimed in claim 7, wherein the auxiliary electrode is formed between the transparent substrate and the transparent electrode.

12. The device as claimed in claim 7, wherein the auxiliary electrode is formed between the transparent electrode and the thin-film layer.

13. A luminescent device comprising:
- a transparent substrate including a light exit surface and an incident surface, the light exit surface including a diffusion mechanism for diffusing light; and
- a luminescent element formed on the incident surface of the transparent substrate, the luminescent element including:
  - a transparent electrode formed on the incident surface of the transparent substrate;
  - an auxiliary electrode formed on part of the transparent electrode; and
  - a thin-film layer, formed on the transparent electrode, for emitting light,
- wherein the diffusion mechanism is formed on the light exit surface at only a portion corresponding to the auxiliary electrode.

14. The device as claimed in claim 13, wherein the diffusion mechanism includes projections formed at random.

15. The device as claimed in claim 13, wherein the auxiliary electrode includes an uneven surface facing towards the transparent substrate.

16. The device as claimed in claim 13, wherein the luminescent element is an organic electroluminescence element.

17. The device as claimed in claim 13, wherein the auxiliary electrode is formed between the transparent substrate and the transparent electrode.

18. The device as claimed in claim 13, wherein the auxiliary electrode is formed between the transparent electrode and the thin-film layer.

19. A luminescent device comprising:
- a transparent substrate including a light exit surface and an incident surface; and
- an optical sheet, arranged on the light exit surface of the transparent substrate and including a diffusion mechanism for diffusing light; and
- a luminescent element formed on the incident surface of the transparent substrate, the luminescent element including:
  - a transparent electrode formed on the incident surface of the transparent substrate;
  - an auxiliary electrode formed on part of the transparent electrode; and
  - a thin-film layer, formed on the transparent electrode, for emitting light,
- wherein the diffusion mechanism is formed on the optical sheet at only a portion corresponding to the auxiliary electrode.

20. The device as claimed in claim 19, wherein the diffusion mechanism includes projections formed at random.

21. The device as claimed in claim 19, wherein the auxiliary electrode includes an uneven surface facing towards the transparent substrate.

22. The device as claimed in claim 19, wherein the luminescent element is an organic electroluminescence element.

23. The device as claimed in claim 19, wherein the auxiliary electrode is formed between the transparent substrate and the transparent electrode.

24. The device as claimed in claim 19, wherein the auxiliary electrode is formed between the transparent electrode and the thin-film layer.

* * * * *

UNITED STATES PATENT AND TRADEMARK OFFICE
CERTIFICATE OF CORRECTION

PATENT NO. : 7,193,362 B2  Page 1 of 1
APPLICATION NO. : 10/859753
DATED : March 20, 2007
INVENTOR(S) : Yoshifumi Kato et al.

It is certified that error appears in the above-identified patent and that said Letters Patent is hereby corrected as shown below:

On the Title page

(75) Inventors

Please delete "Mitsuhara Muta", and substitute therefor --Mitsuharu Muta--.

Signed and Sealed this

Twenty-ninth Day of April, 2008

JON W. DUDAS
*Director of the United States Patent and Trademark Office*